United States Patent [19]

Balian et al.

[11] Patent Number: 5,635,287
[45] Date of Patent: Jun. 3, 1997

[54] PANE PROVIDED WITH A FUNCTIONAL FILM

[75] Inventors: Pierre Balian, Paris; Jean-Francois Oudard, Thiescourt, both of France

[73] Assignee: Saint-Gobain Vitrage International, Courbevoie, France

[21] Appl. No.: 292,044

[22] Filed: Aug. 18, 1994

Related U.S. Application Data

[63] Continuation of Ser. No. 66,248, May 25, 1993, abandoned.

[30] Foreign Application Priority Data

May 26, 1992 [FR] France ................................ 92 06449
Feb. 11, 1993 [FR] France ................................ 93 01545

[51] Int. Cl.⁶ ........................ B32B 7/02; C03C 17/34; C23C 16/22
[52] U.S. Cl. .................. 428/216; 428/215; 428/336; 428/426; 428/428; 428/432; 428/697; 428/699; 428/701; 428/702
[58] Field of Search ........................ 428/336, 426, 428/428, 215, 216, 432, 697, 699, 701, 702

[56] References Cited

U.S. PATENT DOCUMENTS

| | | | |
|---|---|---|---|
| 4,308,316 | 12/1981 | Gordon | 428/336 |
| 4,859,532 | 8/1989 | Oyama et al. | 428/336 |
| 4,895,734 | 1/1990 | Yoshida et al. | |
| 4,996,105 | 2/1991 | Oyama et al. | 428/336 |
| 5,206,089 | 4/1993 | Vilato et al. | 428/426 |
| 5,248,545 | 9/1993 | Proscia | 428/212 |

FOREIGN PATENT DOCUMENTS

| | | |
|---|---|---|
| 0 254 349 | 10/1991 | European Pat. Off. |
| 0 465 309 | 1/1992 | European Pat. Off. |
| A 2 439 167 | 5/1980 | France |
| A 0 518 755 | 12/1992 | France |

OTHER PUBLICATIONS

*Optics*, Eugene Hecht, 2 ed., 1987, pp. 373–375 pub. by Addison-Wesley Publishing. Co.

Primary Examiner—D. S. Nakarani
Attorney, Agent, or Firm—Oblon, Spivak, McClelland, Maier & Neustadt, P.C.

[57] ABSTRACT

This invention relates to a pane comprising a glass substrate (1) coated with at least one transparent, thin, low-emissivity and/or conducting "functional" film (3), and with an "intermediate" film (2) disposed between substrate (1) and functional film (3). The intermediate film (2) has an optical thickness between 150 and 195 nm, preferably at approximately 168 or 185 nm, so that the residual color of the reflected appearance of the substrate from the "film side" of the pane is in the range of the blues.

8 Claims, 1 Drawing Sheet

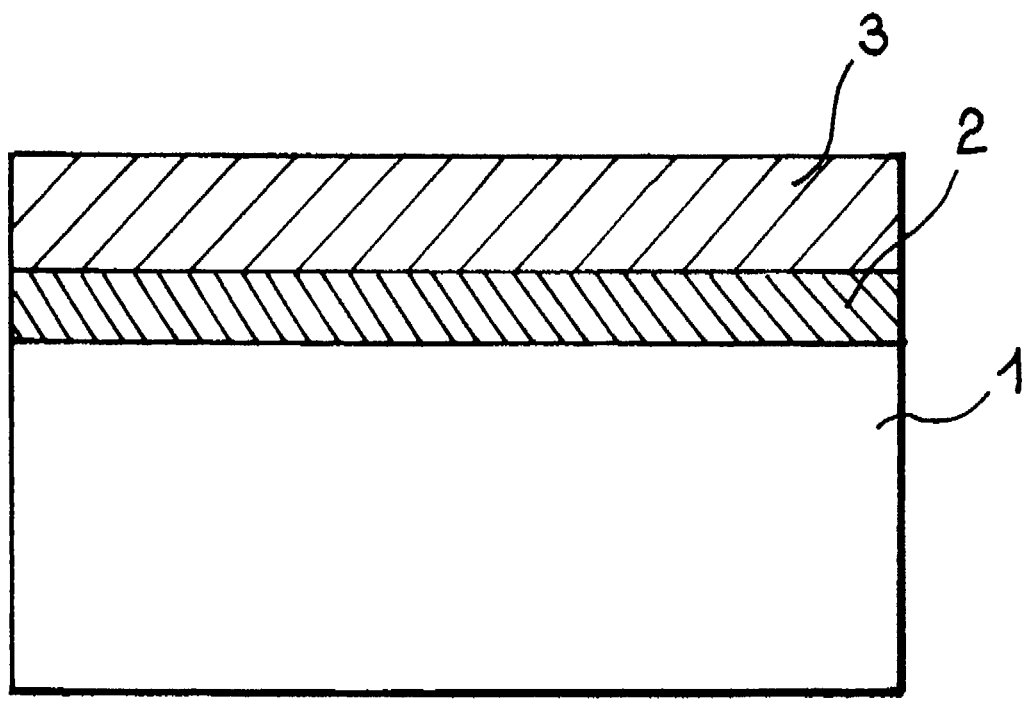
FIG_1

PANE PROVIDED WITH A FUNCTIONAL FILM

This application is a Continuation of application Ser. No. 08/066,248, filed on May 25, 1993, now abandoned.

BACKGROUND OF THE INVENTION

1. Field of the Invention

This invention relates to a pane comprising a substrate of glass, coated with a thin functional film, the latter having properties of transparency, electrical conductivity and/or low emissivity, and having disposed between the substrate and functional film, an intermediate film.

The invention also relates to a method for the production of such a pane, in particular by means of pyrolysis techniques or techniques using vacuum.

2. Description of the Prior Art

Panes coated with films with low emissivity are useful for building construction and ship building. It is known that panes coated with such films have emission in the far infrared, in a direction from the inside to the outside of the room, which is substantially reduced as compared to uncoated panes. By reducing the energy losses resulting partly from this escape of radiation out of the room, the comfort of inhabitants inside the room is substantially improved, especially in winter. If such a film-coated glass substrate is then associated with another substrate through the intermediary of a layer of gas (so that the low-emissivity film is situated on face 3 counting from the outermost face), a very efficient insulating double glazing is formed.

Panes coated with functional films are also useful in applications relating to automobiles because of their electrical conduction properties which make them ideal as, for example, heating panes when provided with electrical supply conductors. Various thin films composed of metal oxide films are known which exhibit these properties, such as films of indium oxide doped with tin (ITO); zinc oxide doped with aluminum (ZnO:Al), indium (Zno:In), tin (ZnO:Sn) or fluorine (ZnO:F); or tin oxide doped with fluorine ($SnO_2$:F). For example, films of aluminum oxide, titanium oxide, tin oxide, zinc oxide and indium oxide, are described in French Patent Application FR-A-2 670 199.

These metal oxide films can be produced by various processes including vacuum processes such as thermal evaporation or cathodic sputtering (possibly assisted by magnetron) or by the pyrolysis of organometallic compounds projected by a carrier gas in liquid, solid or gaseous form, onto the surface of a glass substrate which is heated to a high temperature but which nevertheless has not reached its softening point. These organometallic compounds, when brought into contact with a hot glass surface, decompose by oxidizing to form a metallic oxide film on the surface of the glass. The latter technique is especially advantageous because it can be used to deposit a metal oxide film continuously onto a glass ribbon directly from a production line of the float type.

Thin films can also be deposited by processes well known in the art such as by pyrolysis, especially by gaseous process CVD (Chemical Vapor Deposition), as taught in French Patent Application FR-A-2 677 689 or by a plasma-CVD technique, as taught in Patent Application EP-A-413 617.

Thin films composed of metal oxides can also be deposited by powder pyrolysis of organometallic precursors, or alternatively, by liquid pyrolysis of organometallic precursors, as proposed in European Patent Application EP-A-465 309.

Films of tin oxide doped with fluorine have been produced from dibutyl tin oxide (DBTO) in powder form and gaseous anhydrous hydrofluoric acid as described in patent FR-2 380 997, and from dibutyl tin difluoride (DBTF), possibly in a mixture with DBTO, as described in EP-A-178 956 or EP-A-039 256. Films of ITO, have been produced, for instance, from indium formate and a tin compound such as DBTO as described in EP-A-192 009.

Films of $SnO_2$:F have also been produced by pyrolysis of compounds in the gaseous phase, preferably from a mixture of tin compounds such as $(CH_3)_2$, $SnCl_2$, $(C_4H_9)_2$ $SnCl_2$, $Sn(C_2H_5)_4$ and organofluorinated compounds such as $CCl_2F_2$, $CHCl_2$ and $CH_3CHF_2$, as described in Patent Application EP-A-027 403, and from monobutyl tin trichloride and a compound of the formula $XCHF_2$, such as chlorodifluoromethane, as described in Patent Application EP-A-121 459.

Films of $SnO_2$:F have also been obtained in the liquid phase from tin acetylacetonate and from dimethyltin-2-propionate in suitable organic solvents, as described in French Patent 2 211 411.

Films of zinc oxide doped with indium or with aluminum have been produced by pyrolysis in the vapor phase from diethylzinc or zinc acetate and triethylindium, indium chloride, triethylaluminium or aluminum chloride, as described in Patent Application EP-A-385 769.

However, in order for any of the above films to function satisfactorily in terms of emissivity and/or electrical conduction, they must have a geometric thickness of at least 180 to 400 nm, and usually must be between 300 and 400 nm. Within the latter range of thicknesses, these films coated panes have a colored reflected appearance on the "film side" which is at a level of light reflection and a color intensity which is aesthetically unpleasing.

For example, according to the teaching of Patent EP-B-0 125 153, when a film of tin oxide doped with fluorine $SnO_2$:F having a thickness of approximately 163 to 165 nm, is deposited onto a substrate of clear float glass of 4 mm thickness, the substrate has a reflected color in the blues, a coloration which is much sought after today both in the field of building and in automobile construction. Unfortunately, it has been found that when a film of the same composition but with a thickness of 360 nm, a film which therefore has better performance characteristics, is coated onto the same substrate, the reflected appearance on the film side is slightly purple, a color which is not desirable due to aesthetic reasons.

It is therefore highly desirable to be able to control the reflected appearance of a glass substrate, especially the residual coloration obtained on the "film side" of a film coated substrate.

SUMMARY OF THE INVENTION

Accordingly, one object of the present invention is to overcome this disadvantage by providing a pane comprising a substrate of glass, equipped with a thin functional film, wherein said pane has good performance characteristics and possesses a colored reflected appearance as pleasing as possible to the eye and, in particular, within the range of the blues.

A second objective of the present invention is to provide a process for producing such pane.

BRIEF DESCRIPTION OF THE PREFERRED EMBODIMENTS

FIG. 1 is a cross-section through a substrate coated according to the present invention.

DETAILED DESCRIPTION OF THE PREFERRED EMBODIMENTS

Accordingly, the present invention provides a pane composed of a substrate of glass coated with at least one thin, transparent, low-emissivity and/or electrically conducting functional film, hereinafter termed "functional film", and with a thin film, hereinafter designated "intermediate film", which is situated between the substrate and the functional film. The optical thickness of the intermediate film is between 150 and 195 nm, preferably close to 168 or 185 nm. This optical thickness imparts a residual reflected color on the "film side" of the substrate which lies in the range of the blues. The "range of the blues" is defined, in the context of the present invention, by a range of wavelengths approximately between 462 and 490 nanometers.

Surprisingly, the insertion of this intermediate film between the functional film and the substrate, imparts a reflected color in the range of blues to be obtained, even and especially if the functional film is relatively thick (at least 300 mm) so as to have a sufficiently low emissivity and/or sufficiently high electrical conductivity.

The intermediate film therefore modifies the reflected color of the substrate in accordance with present-day aesthetic needs without detrimentally effecting the performance of the functional film.

The intermediate film according to the present invention has a refractive index lying approximately between 1.66 and 1.72 and preferably approximately between 1.68 and 1.70.

According to the present invention, the optical thickness of the intermediate film 2 is adjusted according to the thickness of the functional film 3 in order to obtain a desired dominant wavelength and thereby a desired residual color.

The intermediate and functional films according to the present invention are suitably obtained by depositing at least one of the two films by a pyrolysis technique of organometallic or siliceous precursors, and preferably depositing both by a pyrolysis technique.

Suitable intermediate films are composed of oxygen, carbon and silicon (Si, O, C); oxygen, nitrogen and silicon (Si, O, N); or a mixture thereof. Preferably the intermediate film is produced by a technique of pyrolysis of silicic precursors, especially by gaseous process CVD (Chemical Vapor Deposition) or by a plasma-CVD technique.

The intermediate film may alternatively be composed of a mixture of metallic oxides, the relative proportion of which enables the desired refractive index to be adjusted. Suitable metal oxides are aluminum oxide, titanium oxide, tin oxide, zinc oxide and indium oxide. When the intermediate layer is composed of metal oxides, the technique of powder pyrolysis of organometallic precursors is then preferably used.

An alternative and preferred suitable intermediate film is composed of a mixture of metal oxides of aluminum and titanium or tin. When this composition is used, the film is preferably deposited by liquid pyrolysis of organometallic precursors.

Suitable functional films useful in the present invention are composed of doped metallic oxides selected from the group consisting of indium oxide doped with tin (ITO); zinc oxide doped with indium (ZnO:In), fluorine (ZnO:F), aluminum (ZnO:Al) or tin (ZnO:Sn); and also tin oxide doped with fluorine ($SnO_2$:F). In the latter case, the functional film has a refractive index close to 1.9 and a geometric thickness preferably between 300 and 380 nm. Functional films composed of doped metal oxides are suitably produced by pyrolysis techniques, especially of pulverulent compounds.

Functional films of $SnO_2$:F and ITO may advantageously be produced by pyrolysis of powders. Alternatively the functional films can be produced from tin oxide doped with fluorine.

Functional films of $SnO_2$:F may suitably be produced by pyrolysis of compounds in the gaseous phase, preferably from a mixture of tin compounds such as $(CH_3)_2$, $SnCl_2$, $(C_4H_9)_2$ $SnCl_2$, $Sn(C_2H_5)_4$ and organofluorinated compounds such as $CCl_2F_2$, $CHCl_2$ and $CH_3CHF_2$, or from monobutyl tin trichloride and a compound of formula $XCHF_2$. Suitable films of $SnO_2$:F may also be obtained in the liquid phase from tin acetylacetonate or from dimethyltin-2-propionate in suitable organic solvents.

Functional films of zinc oxide doped with indium or with aluminum may be produced by pyroiysis in the vapor phase, from diethylzinc or zinc acetate and triethylindium, indium chloride or triethylaluminium, aluminum chloride.

Both the intermediate and functional films can be deposited in a float glass production installation by first depositing the intermediate film by CVD in the float enclosure itself, and subsequently depositing the functional film by powder pyrolysis onto the glass band between the float enclosure and the cooling zone.

Other details and advantageous characteristics of this invention will become apparent from the following description of non-limiting examples of embodiment thereof, with reference to FIG. 1.

EXAMPLES

The optical thickness of the intermediate film 2 was adjusted according to the thickness of the functional film 3 in order to obtain the desired dominant wavelength and thereby the desired residual color.

In the three examples, and as shown in FIG. 1, the substrate 1 was of clear silico-sodo-calcic glass of 4 mm thickness, overlain by an intermediate film 2 composed of silicon, oxygen and carbon and produced by CVD in accordance with the teaching of the aforementioned French Patent Application FR-A-2 677 689, and further coated with a functional film 3 of $SnO_2$:F produced by powder pyrolysis from D.B.T.F. It should be emphasized that the representation in FIG. 1 is highly schematic and does not show the relevant proportions of thicknesses of the materials 1, 2, 3, for reasons of improved clarity.

All the spectrophotometric measurements were carried out with reference to illuminant $D_{65}$.

The abbreviations used in Table I below, which summarizes the characteristics in light reflection of the examples, have the following meanings: "$R_L$ (%)" light reflection as a percentage; "Pe" and "λdom" the purity of excitation as a percentage measured with perpendicular incidence and the dominant wavelength in nanometers respectively in the chromatic diagram (x, y); c the saturation where c= $\sqrt{a^{*2}+b^{*2}}$ in the colorimetry system (L*, a*, b*) and "CR" the residual color in reflection.

All the thicknesses of the films 2 and 3 are given in nanometers.

Example 1

The functional film 3 was composed of $SnO_2$:F with a geometrical thickness of 340 nm and a refractive index substantially equal to 1.9. The intermediate film 2 was composed of Si, O, and C with a geometric thickness of 15 to 100 nm and a refractive index substantially equal to 1.68.

The thus coated substrate had an emissivity of 0.17 and a reflected appearance from the "film" side which was very neutral, with a residual color CR of very pale whitish blue.

Example 2

The functional film 3 had the same characteristics as in Example 1. The intermediate film 2 was composed of Si, O, C with a geometric thickness of 110 nm and a refractive index of approximately 1.68.

The substrate had an emissivity equal to that of Example 1. Its reflected appearance from the "film" side was slightly less neutral than in Example 1, but exhibited a scarcely perceptible difference in coloration intensity. The residual color remaining was within the range of the blues.

Example 3

The intermediate film 2 had the same characteristics as those of Example 1. In contrast, the functional film 3 was composed of $SnO_2$:F with a thickness of 400 nm. The residual color was still in the blues.

| Ex. | $R_L$ (%) | Pe | λdom | c | CR |
| --- | --- | --- | --- | --- | --- |
| 1 | 12 | 4.7 | 487 | 2.8 | blue |
| 2 | 12 | 6.3 | 491 | 4.6 | blue |
| 3 | 12 | 5 | 480 | — | blue |

These examples demonstrate that the present invention provides panes with a blue reflected color, even when the functional film is thick. Numerous additional advantages also were achieved. Firstly, the saturation values and purity values were low, which implies that the blue tint is fairly "washed with white", that is to say soft, pastel and pleasing to the eye. In fact, the residual color saturations in panes according to the present invention, remain at a value below 7 and even below 5.

In addition, the substrate visualized from the film side retains its blue reflected color whatever the angle of viewing. Thus, a building facade, for instance, entirely equipped with panes comprising this type of coated substrate retains, for outdoor viewers, its blue appearance uniformly and continuously over its entire surface.

What is claimed as new and desired to be secured by Letters Patent of the United States is:

1. A pane for a building or automobile having reduced thermal emission comprising a glass substrate coated with at least one transparent, electrical-conducting, low-emissivity functional film having a refractive index of approximately 1.9 and a geometric thickness of between 300 and 420 nm, wherein an intermediate film is disposed between said substrate and said functional film, wherein the optical thickness of said intermediate film is between 168 and 185 nm and the refractive index ranges from 1.66 to 1.72 so as to obtain a blue residual reflected color on the film side of the substrate;

said intermediate film and functional film being deposited on said substrate via pyrolysis of organometallic or silicic precursors, said blue reflected residual color having a saturation c in the colorimetry system ($L^*$, $a^*$, $b^*$) of less than 5.

2. The pane according to claim 1, wherein the refractive index of said intermediate film is between 1.68 and 1.70.

3. The pane according to claim 1, wherein said functional film comprises at least one doped metallic oxide selected from the group consisting of indium oxide doped with tin (ITO); zinc oxide doped with indium (ZnO:In), fluorine (ZnO:F), aluminum (ZnO:Al) or tin (ZnO:Sn); and tin oxide doped with fluorine ($SnO_2$:F).

4. The pane according to claim 3, wherein said functional film is a film pyrolized from pulverulent compounds.

5. The pane according to claim 1, wherein said intermediate film comprises oxygen, silicon, carbon (Si, O, C); oxygen, silicon, nitrogen (Si, O, N); or a mixture thereof.

6. The pane according to claim 1, wherein said intermediate film is composed of a mixture of metallic oxides, comprising aluminum oxide and at least one metal oxide selected from the group consisting of zinc oxide, indium oxide, tin oxide and titanium oxide.

7. The pane according to claim 1, wherein said intermediate film has a physical thickness of approximately 100 to 110 nm and a refractive index of approximately 1.68 and wherein said functional film has a physical thickness of approximately 340 nm to 400 nm, so as to obtain a blue residual reflected color on the film side of the pane.

8. The pane as claimed in claim 1, consisting of said substrate, said intermediate film and said functional film.

* * * * *